(12) United States Patent  
Beasley

(10) Patent No.: US 8,742,245 B2
(45) Date of Patent: *Jun. 3, 2014

(54) METHOD AND APPARATUS FOR USING THERMIONIC DEVICES TO RECOVER ENERGY FROM LIGHT SOURCES AND OTHER ENERGY CONVERSION DEVICES

(71) Applicant: Robertson Transformer Co., Blue Island, IL (US)

(72) Inventor: Denny D. Beasley, La Grange Park, IL (US)

(73) Assignee: Robertson Transformer Co., Blue Island, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/957,054

(22) Filed: Aug. 1, 2013

(65) Prior Publication Data

US 2013/0312805 A1 Nov. 28, 2013

Related U.S. Application Data

(63) Continuation of application No. 13/131,198, filed as application No. PCT/US2009/065882 on Nov. 25, 2009, now Pat. No. 8,531,110.

(60) Provisional application No. 61/117,827, filed on Nov. 25, 2008.

(51) Int. Cl.
 *H01L 35/28* (2006.01)
(52) U.S. Cl.
 USPC .......................................... 136/207; 136/205
(58) Field of Classification Search
 None
 See application file for complete search history.

(56) References Cited

U.S. PATENT DOCUMENTS

| 6,784,601 | B2 |   | 8/2004 | Kai et al. |
| 7,103,292 | B2 | * | 9/2006 | Hirst et al. ...................... 399/33 |
| 7,135,033 | B2 | * | 11/2006 | Altshuler et al. .............. 607/88 |
| 7,138,659 | B2 |   | 11/2006 | Raos et al. |

(Continued)

FOREIGN PATENT DOCUMENTS

GB 2243437 A 10/1991

OTHER PUBLICATIONS

Foreign Communication From a Counterpart Application, PCT Application No. PCT/US2009/065882, International Search Report dated Jan. 21, 2010, 1 page.

(Continued)

*Primary Examiner* — Crystal L Hammond
(74) *Attorney, Agent, or Firm* — Conley Rose, P.C.; Grant Rodolph

(57) ABSTRACT

A lamp having a light emitting diode, a Peltier device, a heat sink, a translucent, thermally conductive window, and an optical fluid. The Peltier device is in thermal communication with the light emitting diode and converts a waste thermal energy discharged by the light emitting diode into an electrical energy. Conductors transfer the electrical energy from the Peltier device to a boost circuit which converts a level of a voltage associated with the electrical energy output from the Peltier device to a higher, more useful value. The heat sink transfers a second thermal energy from the Peltier device. The optical fluid is located between the translucent, thermally conductive window and the light emitting diode. The optical fluid has an angle of diffraction having an intermediate value relative to an angle of diffraction associated with the light emitting diode and an angle of diffraction associated with the translucent, thermally conductive window.

20 Claims, 10 Drawing Sheets

(56) References Cited

U.S. PATENT DOCUMENTS

| | | | |
|---|---|---|---|
| 7,168,363 B1* | 1/2007 | Brown | 99/421 M |
| 8,531,110 B2* | 9/2013 | Beasley | 315/112 |
| 2005/0000559 A1* | 1/2005 | Horio et al. | 136/205 |
| 2005/0093718 A1* | 5/2005 | Martin | 340/981 |
| 2006/0092641 A1* | 5/2006 | Phelan et al. | 362/294 |
| 2006/0219284 A1 | 10/2006 | Horio et al. | |
| 2007/0228999 A1 | 10/2007 | Kit | |
| 2011/0184334 A1* | 7/2011 | Altshuler et al. | 604/20 |

OTHER PUBLICATIONS

Foreign Communication From a Counterpart Application, PCT Application No. PCT/US2009/065882, Written Opinion dated Jan. 21, 2010, 6 pages.

* cited by examiner

METHOD AND APPARATUS FOR USING THERMIONIC DEVICES TO RECOVER ENERGY FROM LIGHT SOURCES AND OTHER ENERGY CONVERSION DEVICES

CROSS-REFERENCE TO RELATED APPLICATIONS

This application is a continuation of U.S. patent application Ser. No. 13/131,198 filed Jul. 29, 2011, which is a 35 U.S.C. §371 filing from International Application No. PCT/US2009/065882 filed on Nov. 25, 2009, which claims priority to U.S. Provisional Patent Application No. 61/117,827 filed Nov. 25, 2008, all of which are by Denny D. Beasley, entitled "Method and Apparatus for Using Thermionic Devices to Recover Energy from Light Sources and Other Energy Conversion Devices," and are incorporated herein by reference as if reproduced in their entireties.

TECHNICAL FIELD

The present invention relates to the powering and regeneration of waste heat generated by light sources. More particularly, the present invention relates a method to reclaim the thermal energy using the reclaimed energy to stabilize the operating temperature and/or generate an electrical energy.

BACKGROUND

Wasted heat generated by the operation of light sources, including, but not limited to, light-emitting diodes (LEDs) is always a problem for light source and fixture designers. A method is needed to reclaim thermal energy.

SUMMARY

A first aspect of the invention is directed to a lamp. The lamp comprises: a means for illumination; a means for converting a waste thermal energy from the means for illumination in thermal communication with the means for illumination, wherein the means for converting the waste thermal energy converts the waste thermal energy into an electrical energy; a means for conducting the electrical energy from the means for converting the waste thermal energy; a means for converting a level of a voltage associated with the electrical energy output from the means for converting the waste thermal energy; a heat sink for transferring a second thermal energy from the means for converting the waste thermal energy; a translucent, thermally conductive window; and an optical fluid between the translucent, thermally conductive window and the means for illumination, the optical fluid having an angle of diffraction having an intermediate value relative to an angle of diffraction associated with the means for illumination and an angle of diffraction associated with the translucent, thermally conductive window.

A second aspect of the present invention is directed to a lamp comprising: a light emitting diode; a Peltier device in thermal communication with the light emitting diode wherein the Peltier device converts a waste thermal energy discharged by the light emitting diode into an electrical energy; a means for conducting the electrical energy from the Peltier device; a means for converting a level of a voltage associated with the electrical energy output from the Peltier device; a heat sink for transferring a second thermal energy from the Peltier device; a translucent, thermally conductive window; and an optical fluid between the translucent, thermally conductive window and the light emitting diode, the optical fluid having an angle of diffraction having an intermediate value relative to an angle of diffraction associated with the light emitting diode and an angle of diffraction associated with the translucent, thermally conductive window.

A third aspect of the present invention is directed to a light fixture. The light fixture comprises: a means for illumination; a housing having a chamber in which the means for illumination is at least partially within; a fluid carrying conduit in thermal communication with the means for illumination; a fluid pressure within the fluid carrying conduit, wherein wasted thermal energy from the means for illumination causes a heated fluid pressure within the fluid carrying conduit; a means for converting a thermal energy radiating from fluid pressure into an electrical energy; a means for conducting the electrical energy from the means for converting the thermal energy from the fluid pressure; a means for converting a level of a voltage associated with the electrical energy output of the means for converting the thermal energy from the fluid pressure; and a heat sink for transferring a second thermal energy from the means for converting the wasted thermal energy.

A fourth aspect of the present invention is directed to a lamp. The lamp comprises: a means for illumination; a means for converting a thermal energy to an electrical energy; and a means for conducting the electrical energy from the means for converting.

This aspect of the invention may include one or more of the following features, alone or in any reasonable combination. This aspect may further comprise: a heat sink. The means for illumination may be a light emitting diode in thermal communication with the means for converting the thermal energy, and a waste thermal energy from the light emitting diode may be transferred to the means for converting the thermal energy. The heat sink may receive a second thermal energy from the means for converting the thermal energy. This aspect may further comprise: a translucent, thermally conductive window. This aspect may further comprise: an optical fluid between the translucent, thermally conductive window and the means for illumination. This aspect may further comprise: a fluid carrying conduit in thermal communication with the means for illumination; and a fluid pressure within the fluid carrying conduit, wherein the fluid pressure is adapted to receive a transfer of a thermal energy from the means for illumination. The fluid pressure may be in thermal communication with the means for converting a waste thermal energy to an electrical energy, a thermal energy may be transferable from the fluid pressure to the means for converting a waste thermal energy to an electrical energy. This aspect may further comprise: a means for converting a level of a voltage associated with the electrical energy output of the means for converting the thermal energy. This aspect may further comprise: a microcontroller for controlling an operation of the means for converting a level of a voltage. The means for converting a level of a voltage may be a boost circuit, wherein a voltage associated with the electrical energy output of the means for converting the thermal energy is increased to a second voltage by the boost circuit. This aspect may further comprise: a reflector defining a chamber in which the means for illumination is at least partially within, the means for illumination being a metal halide lamp; a fluid carrying conduit in thermal communication with the means for illumination; a fluid pressure within the fluid carrying conduit, wherein the fluid pressure is adapted to receive a transfer of a thermal energy from metal halide lamp, wherein the fluid pressure is in thermal communication with the means for converting a waste thermal energy to an electrical energy, and wherein a thermal energy is transferable from the fluid pressure to the means for converting a waste thermal energy to an electrical energy; and a means for converting a level of a voltage associated with the electrical energy output of the means for converting the thermal energy.

Another aspect of the present invention is directed to a method to extract thermal energy from lighting fixtures. The method comprises the step of: using a plurality of modes of recovery comprising thermal couples, fluids used in a Carnot cycle and Peltier generators, wherein the extracted thermal energy is used to either improve the overall operational cycle efficiency or fixture thermal management.

This aspect of the invention may include one or more of the following features, alone or in any reasonable combination. A thermal flow may be directed through a thermal-electrical recovery device comprising a Peltier junction, wherein the plurality of modes direct a thermal energy flow from a means for illumination to a heat sinking reservoir. A recovered energy may be reconverted to usable energy/voltage levels and recycled to a power input to the means for illumination and reused in a primary function of the light fixture. A boost circuit may be provided to increase a recovered energy level to a usable level by the light fixture. The light fixture may include a flat clear thermal conducting material to laterally redirect a thermal energy to a recovery area. A fluid having an intermediate index of refraction may be adapted to increase an optical transfer between layers. One quarter wave coatings may be used to reduce internal reflections. The recovered energy may be used to operate auxiliary attachments to enhance, communicate or redirect energy flows in and around a prime source operating object. The recovered energy may be divided between enhancement functions and regeneration to the prime source operating object. A thermal energy from the means for illumination may be used either summated or fractionalized to drive a working fluid in a Carnot-type thermal cycle for altering a local thermal gradient to enhance work space via recovered energies. A thermal energy stored in the working fluid may be stored for time displaced usage or other recovery via low head turbines or other methods of thermal-fluid manipulation.

BRIEF DESCRIPTION OF THE DRAWINGS

To understand the present invention, it will now be described by way of example, with reference to the accompanying drawings in which.

DETAILED DESCRIPTION

Figure 1:
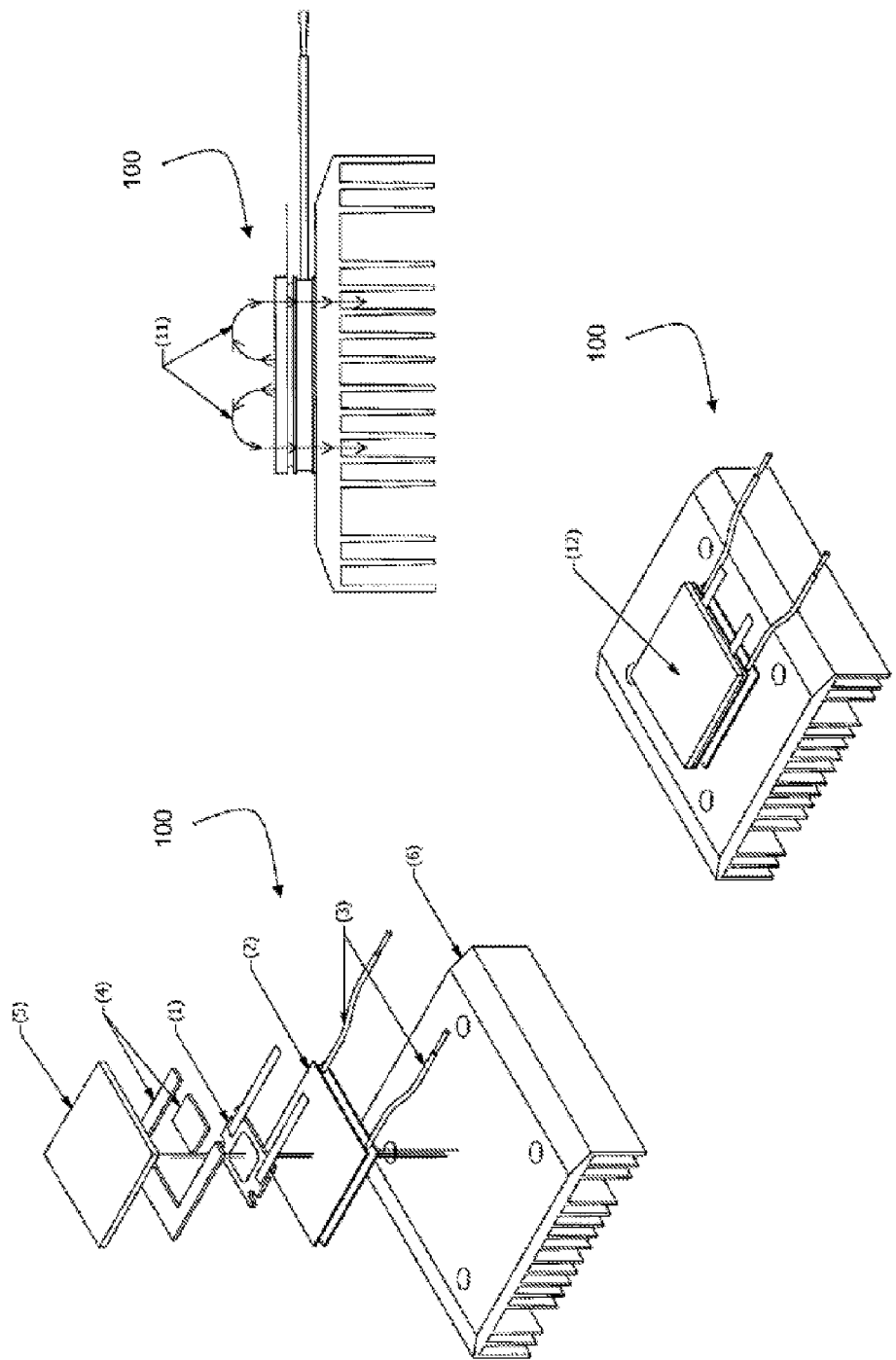
FIG. 1 is a mechanical scenario showing an LED mounted to a Peltier junction.

While this invention is susceptible of embodiments in many different forms, there is shown in the drawings and will herein be described in detail preferred embodiments of the invention with the understanding that the present disclosure is to be considered as an exemplification of the principles of the invention and is not intended to limit the broad aspect of the invention to the embodiments illustrated.

The present invention relates to the powering and regeneration of waste heat generated by light sources. The invention includes a method to reclaim a thermal energy from any heat source to mechanical or electrical conversion technique and then using the reclaimed energy to: 1) use the reclaimed energy to keep the light source in a state of ideal operational equilibrium such as stabilize the operating temperature via a fan of or other devices powered from the waste heat; and 2) convert the waste heat to an electrical energy to a level that a lamp drive can reuse and improve the system efficiency—how much light for a given input wattage.

Methods for conversion of heat energy are well known in the art. Examples of such methods include thermopiles comprising a plurality of thermocouples, Peltier devices, and secondary conversion methods such as phase changes in a working fluid—the working fluid being used to drive other cooling or generating means. A readily available mechanism is a Peltier junction.

Referring to FIG. 1, a device 100 of the present invention is illustrated. This device 100 comprises, a light emitting diode ("LED") 1 mounted, or electrically joined, by any good thermal conductive means to a heat converting means, preferably a Peltier device 2 having voltage output leads 3, thermal conductors such as heat conducting channels 4, a translucent, thermally conductive window 5, and a heat sink 6. This device includes a front side cooling method of the LED junction 1 via the translucent, thermally conductive window 5, which is preferably optically clear, and a redirection of the thermal energy to the heat converting means 2 through heat conducting channels 4. No conversion method is 100% in its operation so a heat will be typically given off to remove what remains of the unconverted energies.

In FIG. 1, the translucent, thermally conductive window 5 is immediately in front of, and in contact with, a front side of the LED 1. The contact may be the front side window alone or in conjunction with an optical fluid 12 to reduce boundary reflection in the optical transmission path. This optical conduction matching is accomplished by providing a medium that has an angle of diffraction that is of an intermediate value to the path through the LED 1 optical path and the translucent, thermally conductive window's 5 value.

Figure 2:
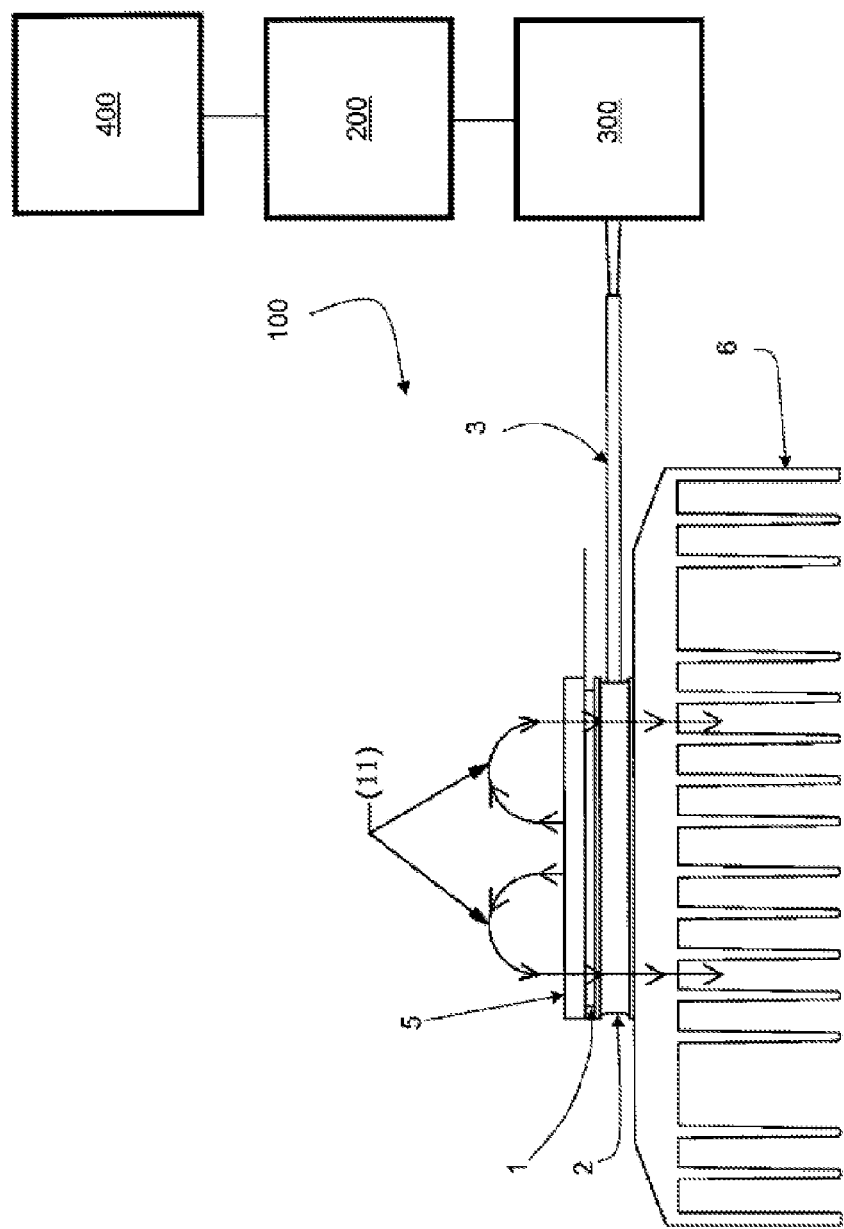
FIG. 2 is a block diagram of an energy flow in the mechanical apparatus.

FIG. 2 shows the flow of heat energies 11 in the above device 100. In this case, a heat source, the LED 1, is shown attached to a conversion platform with a heat sink 6 for uncaptured heat removal. Peltier junctions 2 have thermal differentials of about, but not limited to, 10 to 100 degrees Celsius. This differential created by the heat source 1 and the heat energy flows is characterized by a quantity $E_{source}$. As shown in FIG. 2, the heat energy flows 11 from a greater temperature to a lower temperature. In creating this thermal disequilibrium and resulting heat flow 11, the Peltier junction 2 extracts a part of this heat energy flow 11 as electrical energy. Equation 10 shows the energy balance of the operation $E_e$ is the portion of the energy flow 11 made available.

$$E_{source} = E_e + E_{sink} \quad (10)$$

This action has the ancillary effect of reducing size and cost of heat sinks to remove the un-captured heat by a level proportional to the amount of energy conducted out of the flow as electrical energy.

In addition, since the Peltier junction 2 is typically symmetric in its operation from heat-to-electrical conversion, it can be used as an electrical-to-heat device. In this case, stored energy would be used to drive heat away from the system shown in FIG. 1. The purpose of this is to actively stabilize the LED 1 temperatures where the Peltier junction 2 is driven to produce a thermal gradient that enhances heat flow away from the Peltier junction 2 for short periods of times if the LED 1 were pushed close to non-optimal operation.

Figure 3:
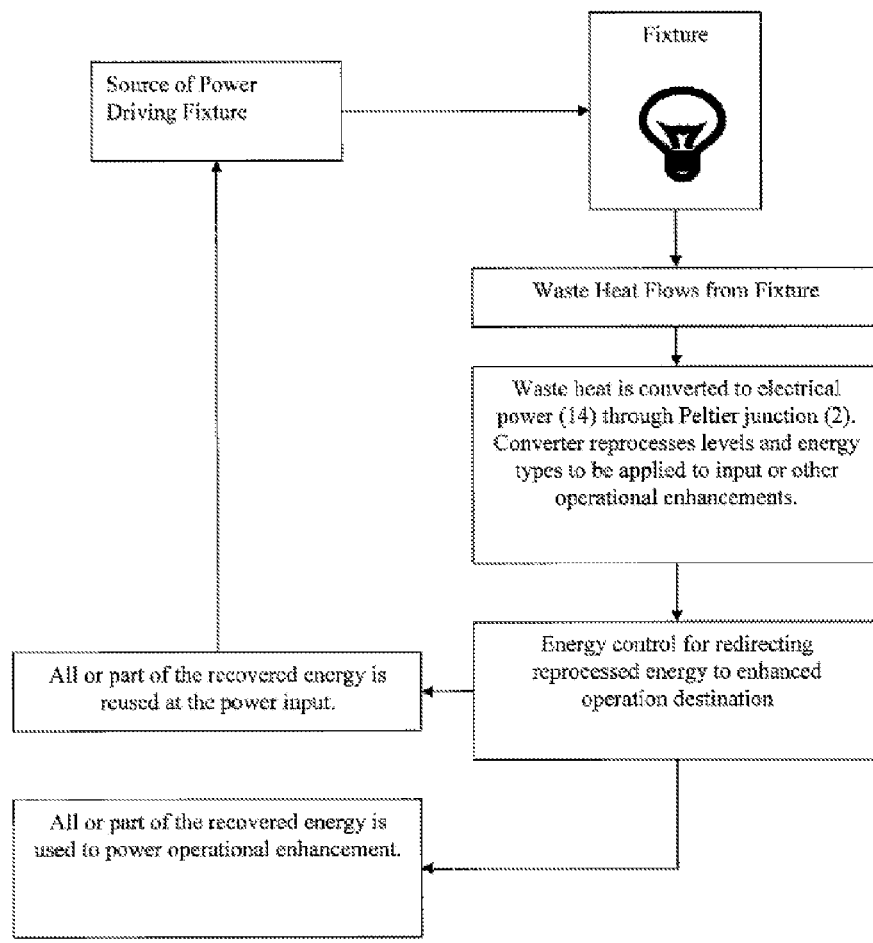
FIG. 3 is an illustration of a recovered energy being fed to a conversion means.

FIG. 3 is flow diagram showing the voltage leads from a Peltier junction (e.g. Peltier junction 2) being applied to a converter to transform the energy to a level where it is regenerated into to a power input supplying a light source power supply. The transformation is by any number of boosting or bucking techniques known in the art.

Figure 4:
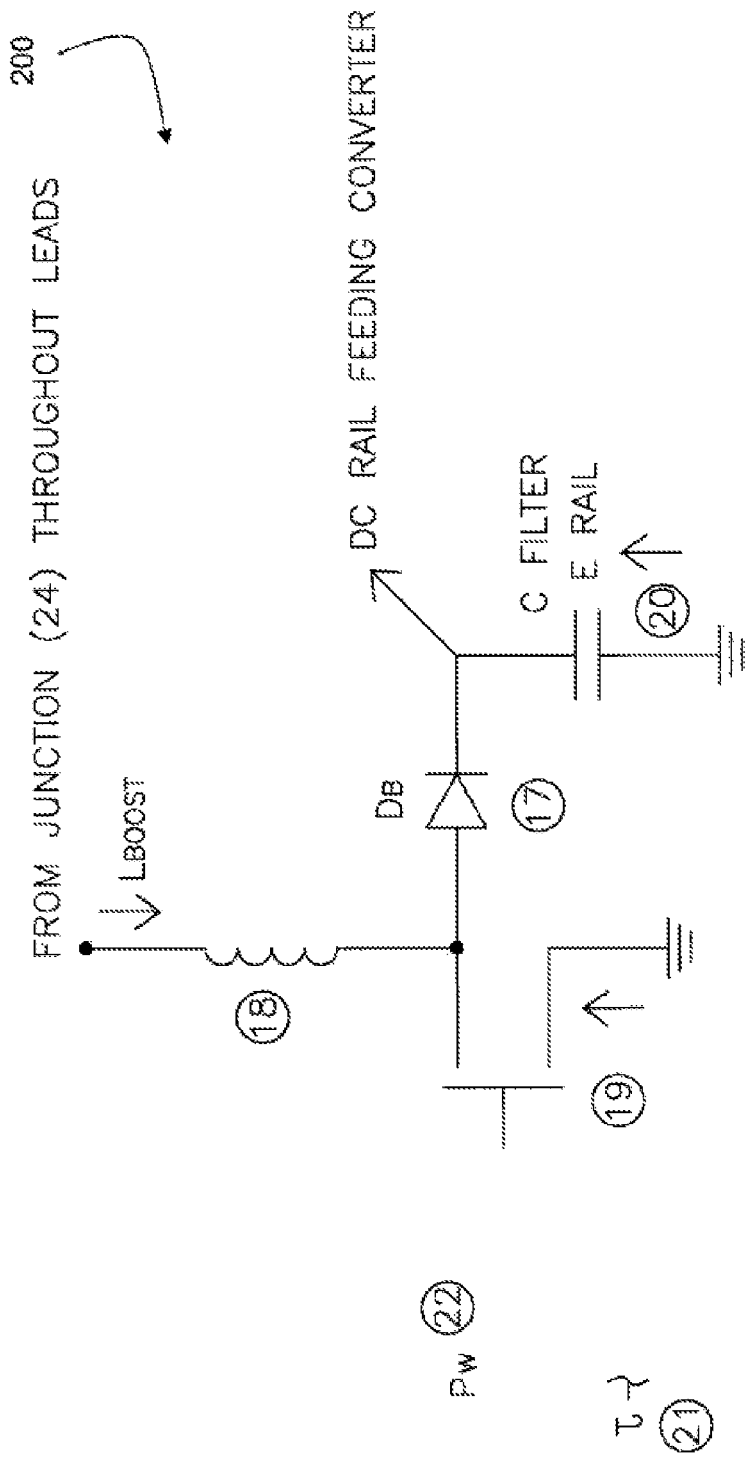
FIG. 4 is a circuit diagram showing a method of energy possible conversion technique.

A boost converter 200 as illustrated in FIG. 4 is one method the recovered energy may be boosted to a new level. The voltage from a Peltier junction (e.g. Peltier junction 2) causes current to flow into an inductor $L_{Boost}$ 18 during an on-time of a switching element 19. A gate voltage 21 is applied to initiate conduction in the switching element 19 for a period of time to store energy derived from the Peltier junction 2. Capacitor 20 is provided to store energy. Diode 17 redirects the energy onto the capacitor 20.

The on-time $P_W$ 22 is controlled by any number of control schemes known in the art to control the boost cycle for optimal energy transfer. However, maximum energy transformation, as derived from the maximum energy transfer, specifies that when the voltage drop across the load is equal to the voltage drop across the internal series impedance.

Figure 5:
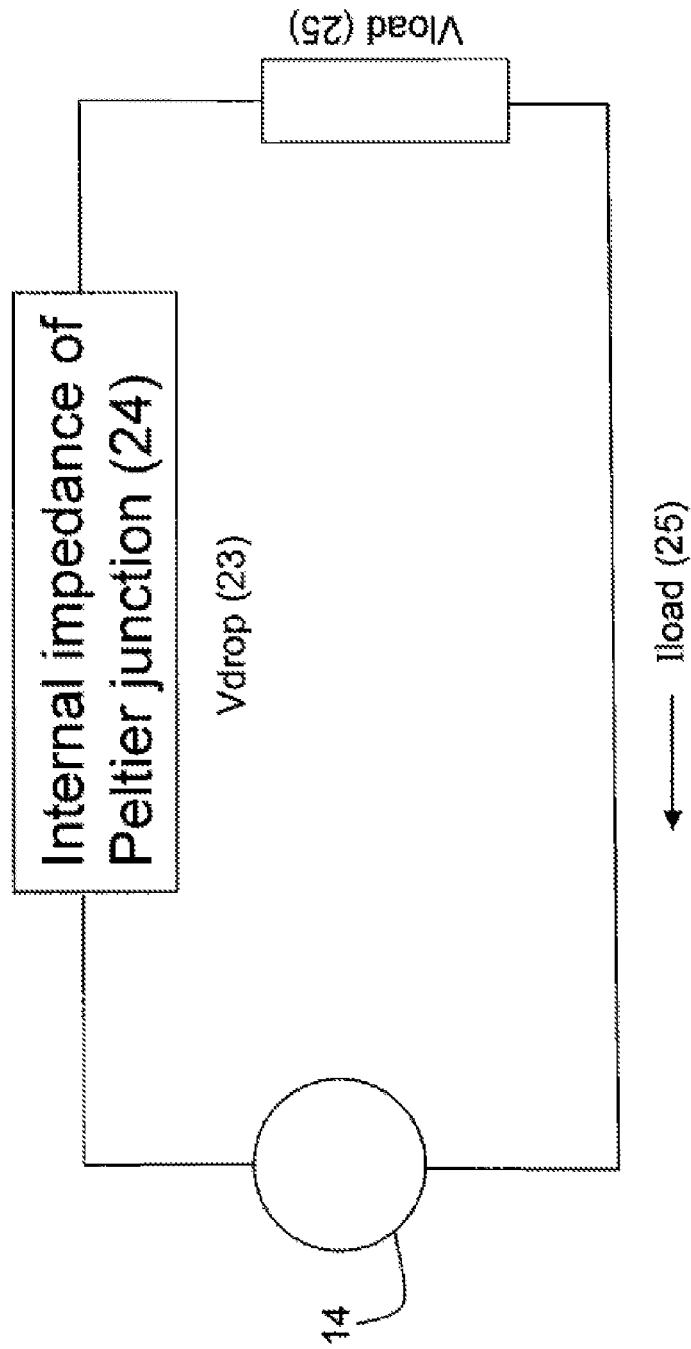
FIG. 5 is a block diagram illustrating a maximum energy transfer criteria.

FIG. 5 illustrates an equivalent circuit for the Peltier junction 2. A generated voltage (Vj) 14 is a voltage generated by the junction in series with a series impedance 24. This supplies energy to a load impedance (Rload) 25.

Figure 6:
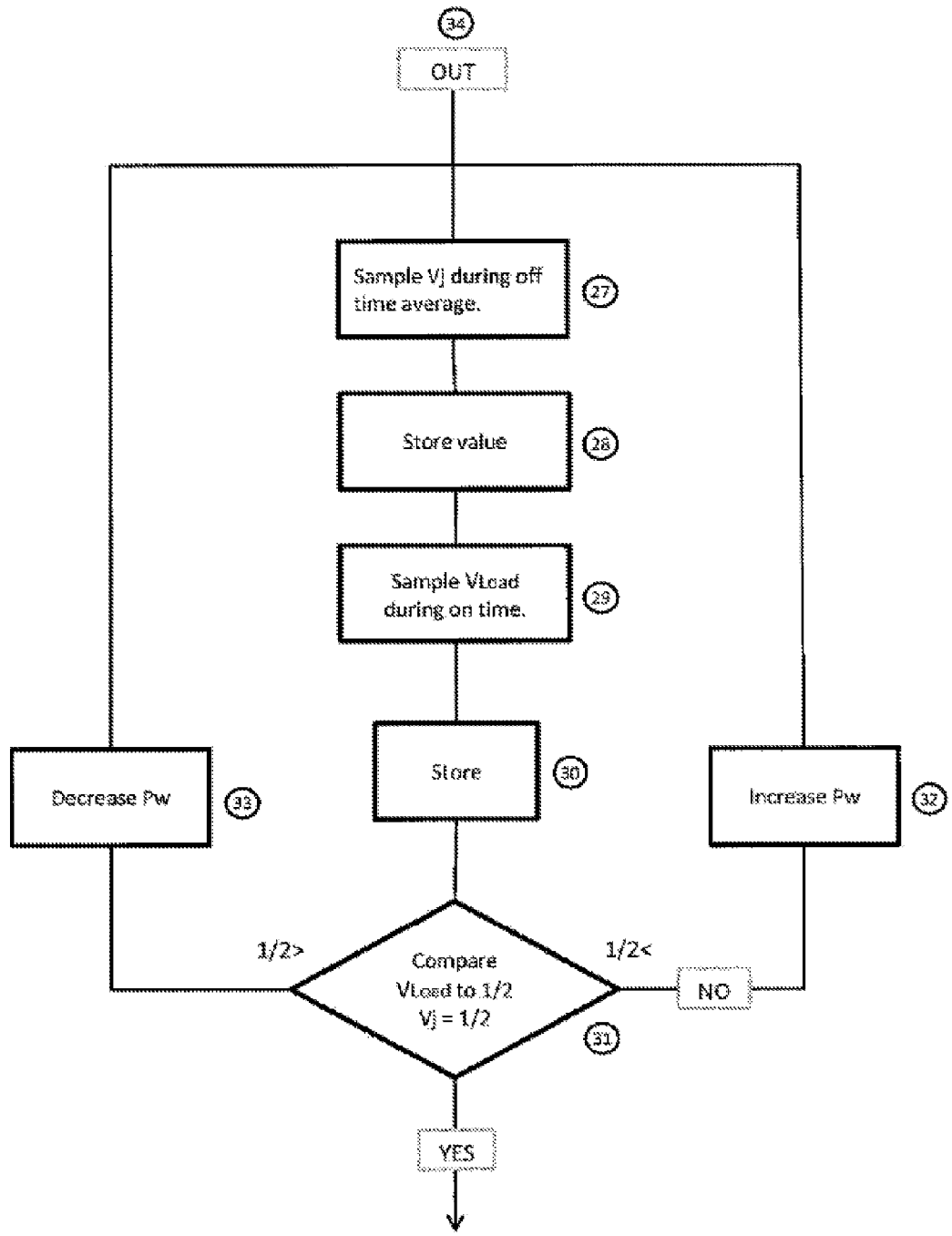
FIG. 6 is a flowchart for a maximum power transfer.

To actively achieve maximum transfer, the boost converter 200 of FIG. 4 could be driven from a microcontroller 300 (see FIG. 2) using the program flow shown in FIG. 6. An open circuit sample 27 would be taken while Vj 14 is not loaded, e.g. the off time of the gate drive, taking a reading of the unloaded source Vj 14. This value would be averaged and stored as an open circuit value 28. When the gate drive is present, another sample would be made to capture a loaded value 29 that would represent the time variant load that a circuit will represent to the Peltier source of FIG. 5. A single sample at the midpoint of the drive cycle or a series of samples averaged over the entire on-time of the gate drive can yield an indication of a loading factor for operation at maximum transfer. This loaded value 29 is then stored 30. A comparison step 31 is then conducted to see if the loaded value 29 is half of the open circuit sample 27. The decision tree would either direct the drive to increase the gate drive on-time (i.e. duty cycle) to increase 32 the loading of Vj 14, decrease the gate drive on-time to decrease 33 the loading of Vj 14, or make no adjustment and loop back to the beginning 34 and continue monitoring.

Output from the boost circuit may be used to power external elements 400 (see FIG. 2), such as fans, other illuminating means, circuits, microprocessors, etc.

Figure 7:
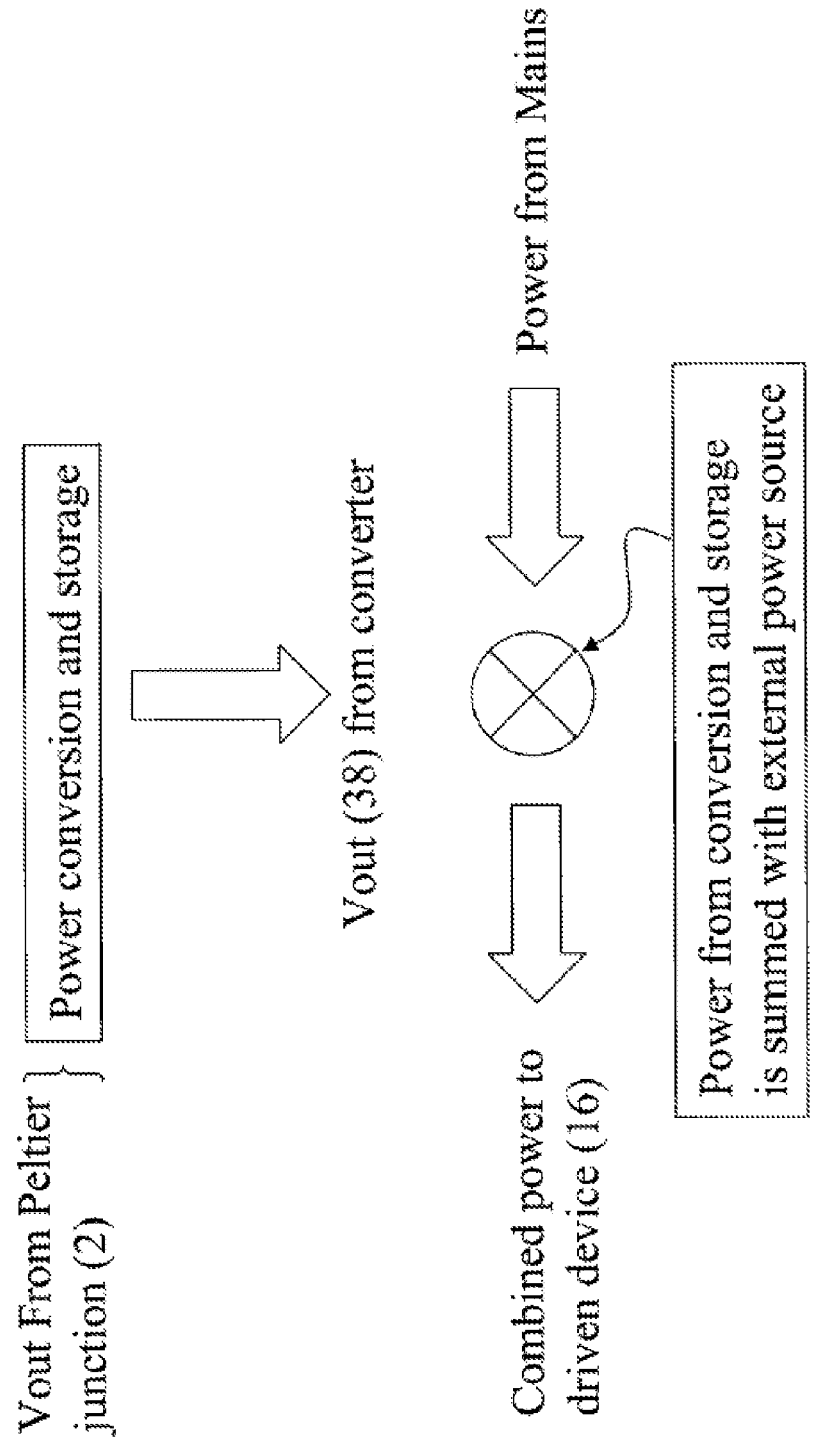
FIG. 7 is a diagram illustrating a converted energy used for emergency lighting and forced cooling.

FIG. 7 shows a configuration where the output 38 of a Peltier junction (e.g. Peltier junction 2) is fed into a converter that can either direct the energy into a storage device, e.g., but not limited to, a battery. Should the battery become completely charged, the excess could then be regenerated into a power input supplying a light source power supply as previously described. Should power be lost, the circuit could switch its power source to the energy stored in the batteries.

Figure 8:
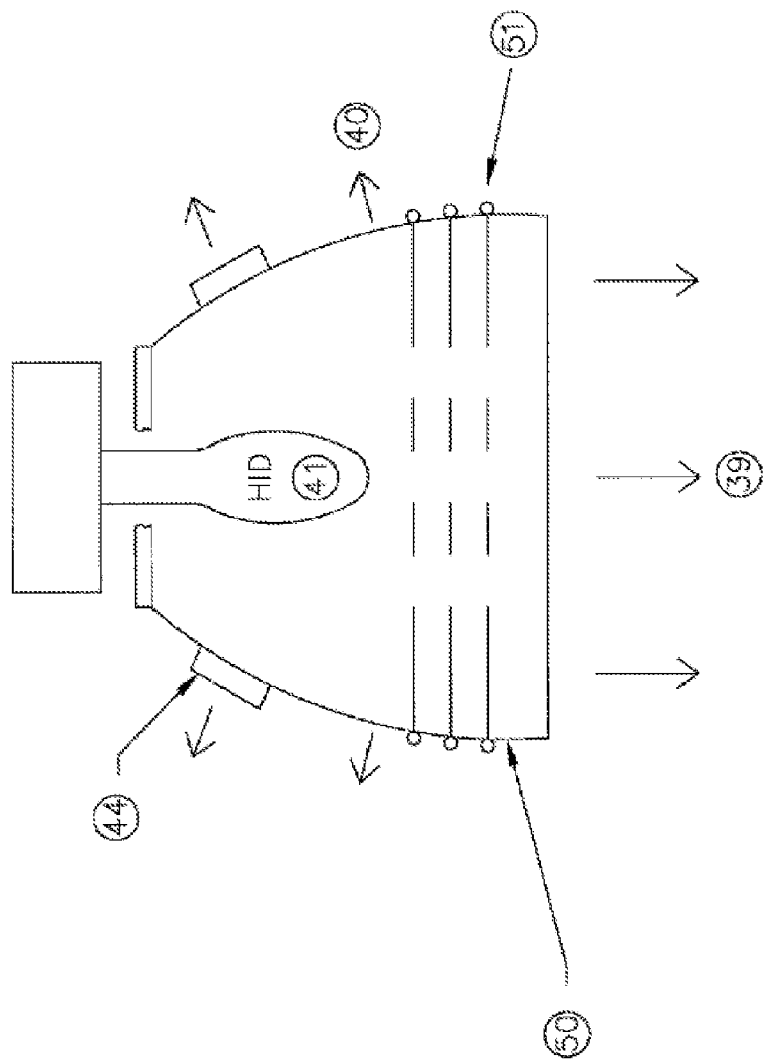
FIG. 8 is a diagram illustrating a fixture showing two scenarios with Peltier junctions 44 and with heat exchanger with working fluid pipes.
Figure 9:
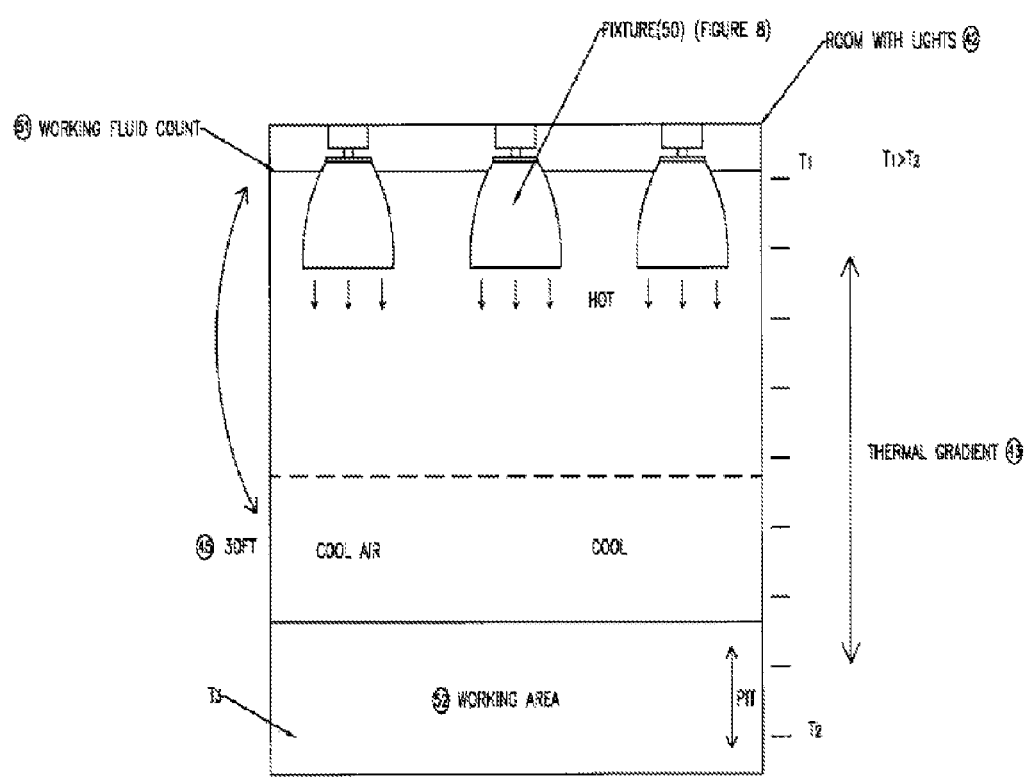
FIG. 9 is a diagram of a room showing thermal gradient with lighting fixtures 50 working fluid conduits 51 and heat exchanger 45 for creating exaggerated thermal gradient at lower working level 52.

Referring to FIGS. 8 and 9, another application of heat recycling may be used in conjunction with high intensity light sources (HID) such as metal halide lamps. Each lamp could be a source for hundreds of watts. One implementation could be Peltier junctions 44 mounted to a reflector 50 defining a chamber in which the lamp is at least partially housed. As described above, the Peltier junctions 44 feed the recovered energy to a lamp drive circuit or use a direct form of conversion to use the waste heat for another purpose such as thermally stratifying a working area. This can work in an installation or room 42 with high ceilings where most HID lighting is located, as illustrated in FIG. 9. A thermal gradient 43 will naturally occur in any space with heat sources. The temperature T1 and T2 in the thermal gradient 43, if not actively interfered with, will be such that T1 will be greater than T2. An effect caused by lower density hot air rising and higher density colder air falling. To assure that the most heat is directed to the Peltier junctions 44, a method may be employed to conduct heat away from the source from 2 sides of a light source 41. This method can be used to cool a work area 52.

Figure 10:
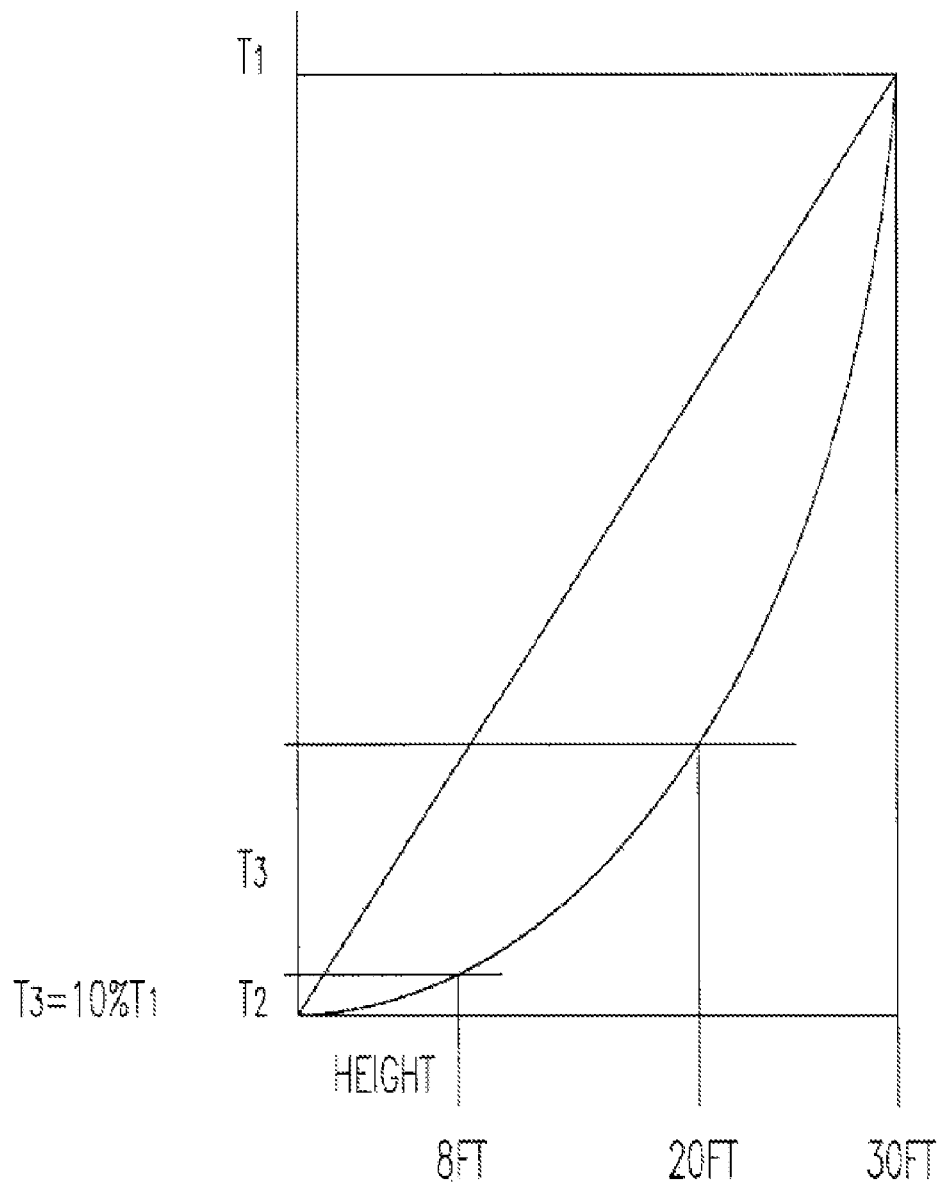
FIG. 10 is a graph showing natural thermal gradient 46 in a room in FIG. 9 and an exaggerated distribution by recapturing waste heat to drive heat exchanger 45.

FIG. 10 shows two gradients 46 and 47. In gradient 46, a native thermal distribution is seen providing a uniform distribution from a floor temperature to a ceiling temperature. In gradient 47, the gradient has a small increase in the early part of the curve then increases more quickly as the height increases. The gradient illustration shows that it could be possible to accentuate the gradient at reduced heights 8 feet and below where people work while at the same time not changing the net gradient significantly. This is achievable by running a working fluid through the reflector 50 as shown in FIG. 8, for example by a fluid pressure within a conduit 51 in thermal communication with the light source 41. This fluid is of a typical type used in Carnot cycle refrigeration systems; however, its energy source is the waste heat or thermal energy of the HID lighting much like refrigerators that use a natural gas heat source for cooling. The arrangement is shown in FIG. 9, the fixtures 50 would heat and pressurize the working fluid where it would be directed to cooling component 45 of the Carnot cycle device. This cold air would be released at the lower level creating a cold strata and thereby create the exaggerated gradient of FIG. 10 gradient 47.

While the specific embodiments have been illustrated and described, numerous modifications come to mind without significantly departing from the spirit of the invention and the scope of protection is only limited by the scope of the accompanying Claims.

What is claimed is:
1. An apparatus comprising:
a light source configured to receive an electrical input power from a primary power source and convert the electrical input power into an output comprising a light output and a waste thermal energy; and
a thermoelectric generator coupled to the light source and configured to absorb the waste thermal energy and convert the waste thermal energy into a recycled electrical power, wherein the recycled electrical power is output to the light source.

2. The apparatus of claim 1, further comprising an electric power converter coupled to the thermoelectric generator and configured to receive the recycled electrical power and convert the recycled electrical power into a recycled electrical input power.

3. The apparatus of claim 2, wherein the electric power converter is an inverter.

4. The apparatus of claim 2, wherein the electric power converter is a direct current (DC) to DC converter.

5. The apparatus of claim 2, wherein the light source comprises at least one electric lighting element.

6. The apparatus of claim 5, wherein the electric lighting element is a solid-state lighting element.

7. The apparatus of claim 6, wherein the solid-state lighting element is a light-emitting diode (LED).

8. The apparatus of claim 5, wherein the electric lighting element is a gas-discharge lamp.

9. The apparatus of claim 8, wherein the gas-discharge lamp is a high-intensity discharge (HID) lamp.

10. The apparatus of claim 2, further comprising a controller coupled to the electric power converter configured to maximize the recycled electrical power received by the electric power converter from the thermoelectric generator.

11. The apparatus of claim 1, wherein the light source is coupled to an emergency power source configured to provide the electrical input power to the light source when the primary power source fails, and wherein a portion of the recycled electrical power is stored in the emergency power source for a future use by the light source.

12. The apparatus of claim 1, further comprising a thermal energy concentrator in thermal communication with the light source and the thermoelectric generator, wherein the thermal energy concentrator is configured to maximize the absorption of the waste thermal energy by the thermoelectric generator.

13. The apparatus of claim 12, wherein the thermal energy concentrator is a translucent thermally conductive window comprising an angle of diffraction, wherein the apparatus further comprises a clear thermally conducting medium intermediating between the light source and the thermally conductive window, wherein the clear thermally conducting medium is configured to modify the light output, wherein the light source comprises an angle of diffraction, and wherein the clear thermally conducting medium comprises an angle of diffraction of an intermediate value relative to the light source and the thermally conductive window.

14. The apparatus of claim 1, further comprising a thermal management device coupled to the thermoelectric generator configured to capture any waste thermal energy not absorbed by the thermoelectric generator and provide a greater thermal differential across the thermoelectric generator.

15. An apparatus comprising:
a light source configured to receive an electrical input power from a primary power source and convert the electrical input power into an output comprising a light output and a waste thermal energy;
a thermoelectric generator coupled to the light source configured to absorb the waste thermal energy and convert the waste thermal energy into a recycled electrical power, wherein the recycled electrical power is output to the light source; and
a fluid conduit in thermal communication with the light source configured to transfer the waste thermal energy from the light source to the thermoelectric generator via a thermal transfer fluid within the fluid conduit.

16. The apparatus of claim 15, wherein the thermal transfer fluid comprises a pressure level, and wherein the waste thermal energy increases the pressure level.

17. The apparatus of claim 16, wherein the thermal transfer fluid drives a Carnot-type thermal cycle that alters a local thermal gradient of a work space in thermal communication with the light source.

18. A method comprising:
receiving a waste thermal energy from a light source configured to receive an electrical input power from a primary power source and convert the electrical input power into an output comprising a light output and the waste thermal energy;
converting the waste thermal energy into a recycled electrical power; and
returning the recycled electrical power to the light source.

19. The method of claim 18, further comprising converting the recycled electrical power into a converted electrical power comprising an electrical property that distinguishes the converted electrical power from the recycled electrical power.

20. The method of claim 18, further comprising storing the recycled electrical power for a future use by the light source.

* * * * *